United States Patent [19]

Yamazaki et al.

[11] Patent Number: 5,046,654
[45] Date of Patent: Sep. 10, 1991

[54] ULTRASONIC WIRE BONDING APPARATUS

[75] Inventors: Nobuto Yamazaki; Yoshimitsu Terakado; Yuji Ohashi; Hijiri Hayashi, all of Tokyo, Japan

[73] Assignee: Kabushiki Kaisha Shinkawa, Tokyo, Japan

[21] Appl. No.: 426,788

[22] Filed: Oct. 25, 1989

[30] Foreign Application Priority Data

Oct. 28, 1988 [JP] Japan .................................. 63-270842

[51] Int. Cl.⁵ .......................................... H01L 21/607
[52] U.S. Cl. ........................................ 228/1.1; 228/102
[58] Field of Search ..................... 228/102, 110, 1.1, 8; 364/477, 484, 488

[56] References Cited

U.S. PATENT DOCUMENTS 4,525,790  6/1985  Nakamura ............................ 364/484
4,808,948  2/1989  Patel et al. ........................... 228/1.1

Primary Examiner—Kenneth J. Ramsey
Attorney, Agent, or Firm—Koda and Androlia

[57] ABSTRACT

An ultrasonic wire bonding apparatus including a ultrasonic oscillation control circuit which causes a transducer having a bonding tool fastened at one end to be vibrated by ultrasonic oscillation voltage. The control circuit includes an electric current amplifier connected to the transducer, an A/D converter to which an electric current amplified by an electric current amplifier is supplied so as to be converted into digital signal which is supplied to a microcomputer, an ultrasonic oscillating circuit, and an output control circuit to which ultrasonic oscillation voltage is supplied from the ultrasonic oscillating circuit. The output control circuit controls the ultrasonic oscillating voltage by comparing it to the ultrasonic oscillating output data supplied from the computer and supplies the thus controlled voltage to the transducer through a power amplifier so as to vibrate the transducer.

2 Claims, 1 Drawing Sheet

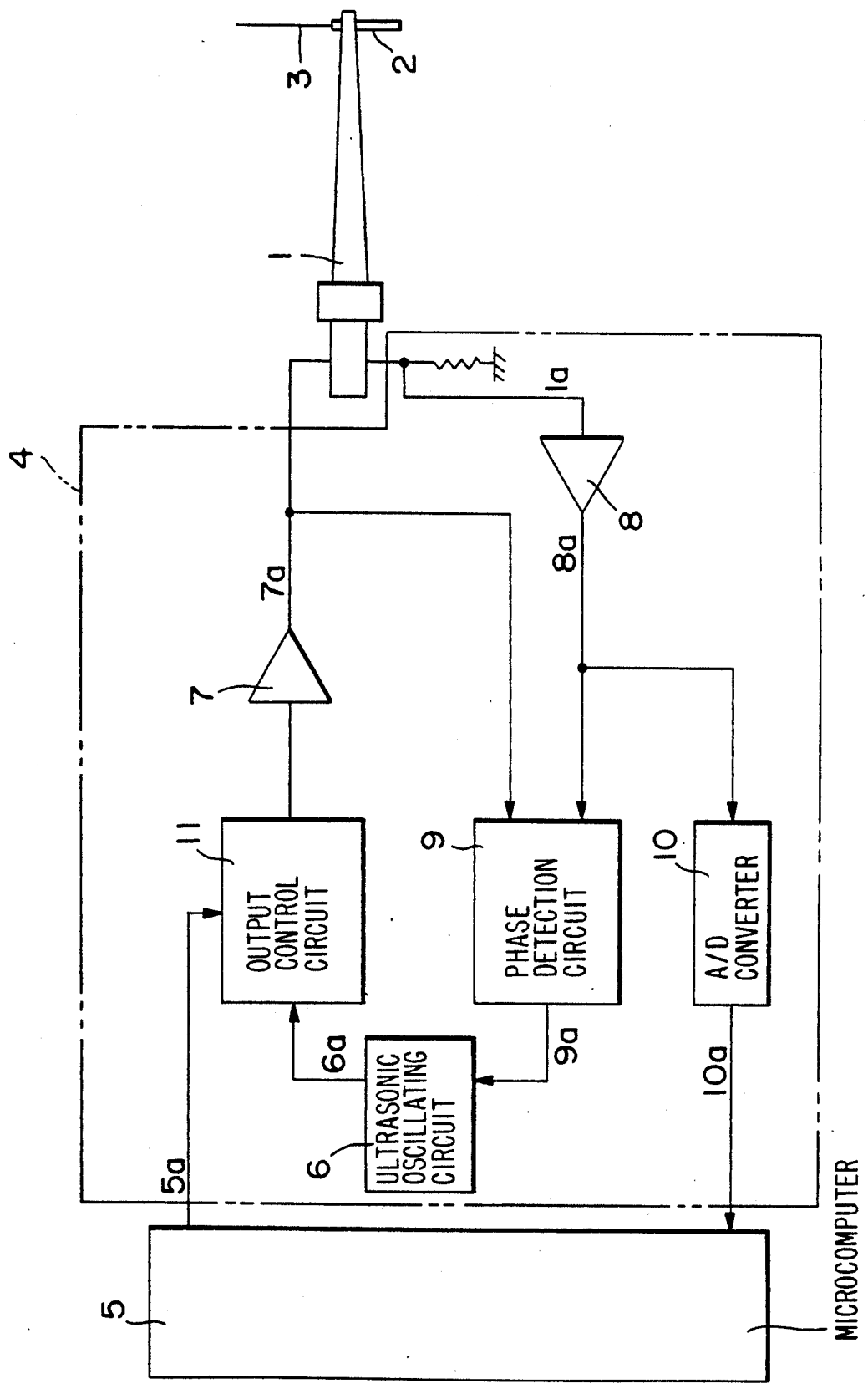

ULTRASONIC WIRE BONDING APPARATUS

BACKGROUND OF THE INVENTION

1. Field of the Invention

The present invention relates to an ultrasonic wire bonding apparatus, and more particularly to a transducer control circuit utilized in such an apparatus.

2. Prior Art

In ultrasonic wire bonders, a bonding tool is attached to the tip of a transducer which generates ultrasonic waves, and a wire bonder is used with a bonding wire passed through this bonding tool. The transducer is lowered so that the bonding wire is pressed against a bonding point by the bonding tool and the bonding wire is bonded to the bonding point by the ultrasonic waves generated from the transducer.

When such transducers are manufactured, there are measurable differences in the characteristics depending upon the quality of the materials used and the precision of working, even though it is desirable to manufacture transducers having identical characteristics. Accordingly, if only transducers with more or less identical characteristics are wanted, all of the transducer whose characteristics show a considerable degree of variance from the selected norm are wasted, thus increasing the unit cost of the product.

In cases where transducers having different characteristics are used, the transducers show different current values even though the same voltage is applied, resulting in different oscillation amplitudes. This causes differences in the pressure bonding strength (the strength with which the bonding wire is pressure-bonded to the bonding point), improper bonding of the bonding wire, etc.

Furthermore, in cases where the same bonding sample is bonded using a multiple number of ultrasonic bonding wire bonders, the bonding work can be performed quickly by setting the necessary data concerning the bonding conditions (e.g., bonding coordinates, ultrasonic oscillating output, ultrasonic oscillation time, bonding load, looping height, etc.) in one of the wire bonders and transferring this data to the other wire bonders, so long as the characteristics of the respective wire bonders are uniform. However, if the transducer characteristics are different, uniform data such as the ultrasonic oscillating output and time requirements cannot be obtained. As a result, bonding work cannot be performed using the same date in respective wire bonders. In other words, it becomes impossible to transfer the bonding conditions from one bonder to another. Thus, bonding condition data must be individually set for each wire bonder.

SUMMARY OF THE INVENTION

Accordingly, the object of the present invention is to provide an ultrasonic wire bonding apparatus which provides the same ultrasonic oscillation using the same bonding condition data, regardless of any differences in the characteristics of the transducers used.

The abovementioned object of the present invention is achieved by a unique structure which includes an output control circuit that controls the output voltage of an ultrasonic oscillating circuit and is provided between an ultrasonic oscillating circuit and a transducer, and a microcomputer which reads the current value of the transducer and outputs ultrasonic oscillating output data to the output control circuit so that a correction can be made for the differences in the transducer characteristics.

With the structure described above, the current value fed back from the transducer is read by the microcomputer. Differences in the characteristics of the transducer are calculated by the microcomputer, and the ultrasonic oscillating output of the computer is corrected so that the current value obtained is the same as the predetermined set data inputted in the computer manually or by data transfer. In the output control circuit, the ultrasonic oscillating voltage of the ultrasonic oscillating circuit is controlled in accordance with the ultrasonic oscillating output data from the microcomputer so that the voltage is applied to the transducer.

BRIEF DESCRIPTION OF THE DRAWINGS

FIG. 1 is a circuit diagram of one embodiment of the present invention.

DETAILED DESCRIPTION OF THE INVENTION

Below, one embodiment of the present invention will be described with reference to FIG. 1.

A transducer 1 is installed on a bonding head (not shown) so that it can be moved up and down. This transducer 1 is driven up and down by means of a vertical driving means (not shown). A bonding tool 2 is attached to a tip portion of the transducer 1, and a bonding wire 3 is passed through this bonding tool 2.

The transducer 1 is connected to a microcomputer 5 via an ultrasonic oscillation control circuit 4.

The ultrasonic oscillation control circuit 4 has an ultrasonic oscillating circuit 6. This circuit 6 outputs an ultrasonic oscillating voltage 6a which is applied to the transducer 1 via a power amplifier 7 so that the transducer 1 generates ultrasonic waves.

Output voltage 7a of the power amplifier 7 and current 8a which is current 1a of the transducer 1 amplified by a current amplifier 8, are input into phase detection circuit 9. This phase detection circuit 9 reads both the voltage phase and current phase and outputs a voltage 9a (which is proportional to the phase shift detected) to the ultrasonic oscillating circuit 6. Based on the voltage 9a corresponding to the phase shift, the ultrasonic oscillating circuit 6 outputs an ultrasonic oscillating voltage 6a which causes the transducer 1 to generate properly tuned ultrasonic waves.

The current 8a of the current amplifier 8 is converted into a digital signal by an A/D converter 10 and inputted into the microcomputer 5 as current data 10a. Furthermore, an output control circuit 11 which controls the voltage applied to the transducer 1 in accordance with ultrasonic oscillating output data 5a from the microcomputer 5 is connected between the ultrasonic oscillating circuit 6 and the power amplifier 7.

In operation, the electric current 1a fed back from the transducer 1 is amplified by the current amplifier 8 and converted into a digital value by the A/D converter 10, and then inputted into the microcomputer 5. The microcomputer 5 calculates the difference in the characteristics of the transducer 1 and outputs ultrasonic oscillating output data 5a (which has been corrected so that ultrasonic oscillation data which agrees with the set data inputted manually or by data transfer is obtained) to the output control circuit 11. As a result, the output control circuit 11 controls the ultrasonic oscillating voltage 6a, which is input from the ultrasonic oscillating circuit 6 in accordance with the ultrasonic oscillating output data 5a, and inputs the voltage into the transducer 1 via the power amplifier 7.

If $E_{set}$ is the voltage actually applied to the transducer 1 for given data programmed in the microcomputer 5, beforehand, and $E_{out}$ is the corrected voltage, then the following equations can be obtained:

$$E_{out} = A \cdot E_{set} \quad (1)$$

$$A = E_{out}/E_{set} \quad (2)$$

Correction can be achieved by determining the coefficient A in Equation 2.

Since the voltage applied to the transducer 1 is thus corrected by the microcomputer 5, the same oscillation amplitude can be obtained even if the vibrational characteristics of the transducer 1, which includes the supporting parts of the transducer, are different. Accordingly, the same bonding strength can be obtained with the same data inputted in different wire bonders. Furthermore, since variation between wire bonders is eliminated, the wire bonders become interchangeable so that data can be transferred therebetween.

As is clear from the above description, the present invention eliminates differences in ultrasonic vibration characteristics between wire bonders. As a result, not only is the setting of bonding conditions facilitated, but it is possible to transfer bonding condition data between wire bonders.

We claim:

1. An ultrasonic wire bonding apparatus wherein a transducer which has a bonding tool fastened at one end is caused to vibrate by ultrasonic oscillating voltage of an ultrasonic oscillating circuit comprising an output control circuit provided between said ultrasonic oscillating circuit and transducer, said output control circuit controlling an output voltage of said ultrasonic oscillating circuit and a microcomputer which reads a current value of said transducer and outputs ultrasonic oscillating output data to said output control circuit so that a correction is made for differences in transducer characteristics.

2. An ultrasonic wire bonding apparatus comprising:
a transducer having at one end a bonding tool;
a microcomputer wherein ultrasonic oscillation data is inputted; and
an ultrasonic oscillation control circuit which includes:
an electric current amplifier connected to said transducer;
an A/D converter to which an electric current amplified by said electric current amplifier is supplied so as to be converted into a digital signal which is supplied to said microcomputer;
an ultrasonic oscillating circuit; and
an output control circuit to which ultrasonic oscillation voltage is supplied from said ultrasonic oscillating circuit, and wherein said output control circuit controls said ultrasonic oscillating voltage by comparing it to ultrasonic oscillating output data supplied from said computer and supplying thus controlled voltage to said transducer through a power amplifier so as to vibrate said transducer.

* * * * *